(12) United States Patent
Schlack

(10) Patent No.: US 11,901,265 B2
(45) Date of Patent: Feb. 13, 2024

(54) HEAT SINK FASTENER

(71) Applicant: Southco, Inc., Concordville, PA (US)

(72) Inventor: Richard E. Schlack, Newark, DE (US)

(73) Assignee: Southco, Inc., Concordville, PA (US)

( * ) Notice: Subject to any disclaimer, the term of this patent is extended or adjusted under 35 U.S.C. 154(b) by 378 days.

(21) Appl. No.: 17/292,254

(22) PCT Filed: Nov. 8, 2019

(86) PCT No.: PCT/US2019/060514
§ 371 (c)(1),
(2) Date: May 7, 2021

(87) PCT Pub. No.: WO2020/097490
PCT Pub. Date: May 14, 2020

(65) Prior Publication Data
US 2021/0372452 A1 Dec. 2, 2021

Related U.S. Application Data

(60) Provisional application No. 62/758,265, filed on Nov. 9, 2018.

(51) Int. Cl.
*H01L 23/40* (2006.01)
*H01L 23/467* (2006.01)

(52) U.S. Cl.
CPC ............ *H01L 23/467* (2013.01); *H01L 23/40* (2013.01); *H01L 23/4006* (2013.01)

(58) Field of Classification Search
CPC ......................... H01L 23/4006; H01L 23/4093
See application file for complete search history.

(56) References Cited

U.S. PATENT DOCUMENTS

| 2,378,122 A * | 6/1945 | Barlow .................. F16B 5/10 411/552 |
| 5,870,287 A | 2/1999 | Rodriguez et al. |
| 9,354,003 B2 * | 5/2016 | Lin ..................... F28F 99/00 |
| 2011/0027038 A1 | 2/2011 | Hsu et al. |
| 2017/0364129 A1 | 12/2017 | Hartman et al. |

FOREIGN PATENT DOCUMENTS

EP 1143156 A1 10/2001

OTHER PUBLICATIONS

International Search Report and Written Opinion for International Application No. PCT/US2019/060514, dated Mar. 16, 2020, 9 pages.
International Preliminary Report on Patentability and Written Opinion for International Application No. PCT/US2019/060514, dated May 11, 2021, 8 pages.

* cited by examiner

*Primary Examiner* — Robert J Hoffberg
(74) *Attorney, Agent, or Firm* — RatnerPrestia

(57) ABSTRACT

A heat sink fastener assembly for fastening a heat sink onto a heat generating computer component. The fastener assembly includes a stud comprising at least one cam follower, and a rotatable nut defining a cam surface. A spring may be mounted to the heat generating computer component, and the spring is biased away from the heat sink. The stud is mounted to the spring and the nut is mounted to the heat sink. A clip mounted to the heat sink provides a secondary catch or attachment of the heat sink to the component.

30 Claims, 12 Drawing Sheets

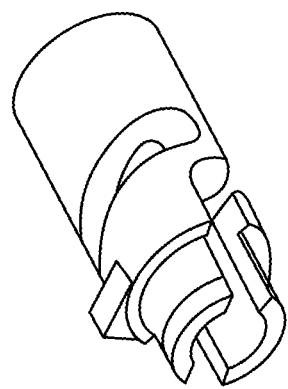
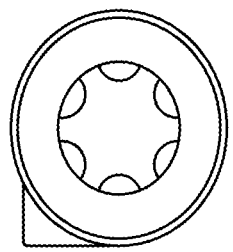
FIG. 10A  FIG. 10B
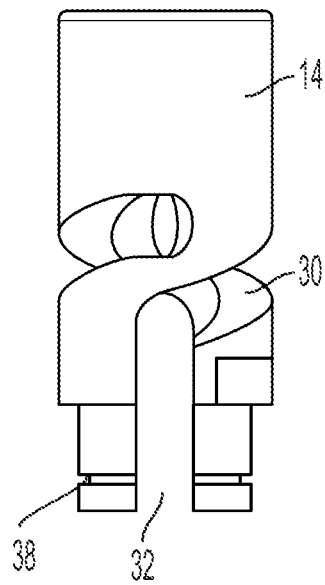
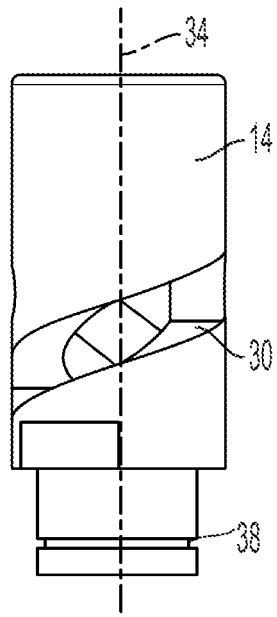
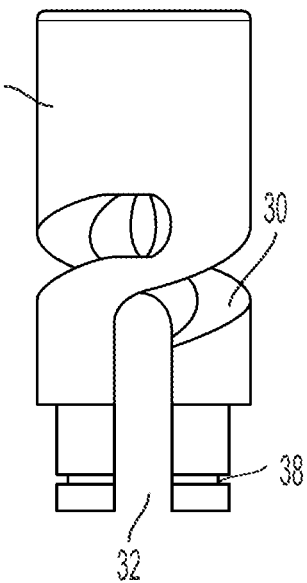
FIG. 10C  FIG. 10D  FIG. 10E
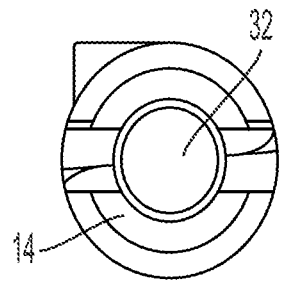
FIG. 10F

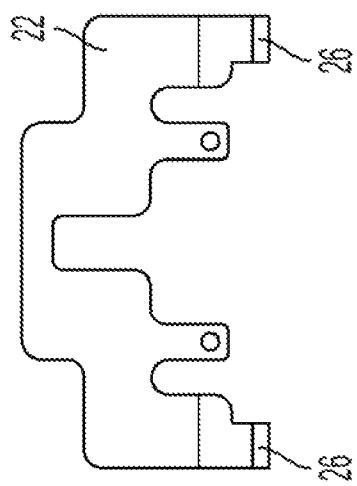
FIG. 12C
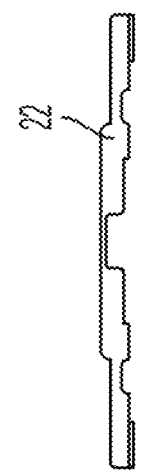
FIG. 12G
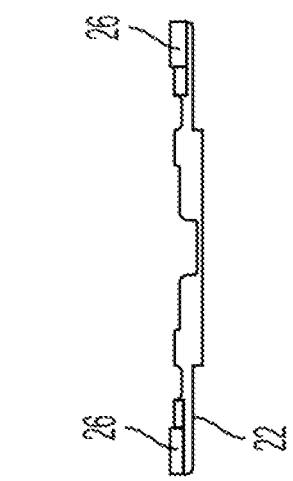
FIG. 12B
FIG. 12F
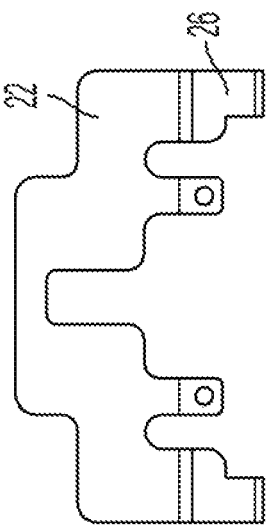
FIG. 12E
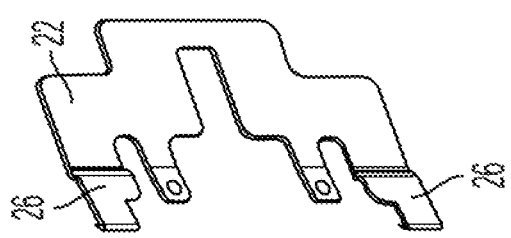
FIG. 12A
FIG. 12D

HEAT SINK FASTENER

CROSS REFERENCE TO RELATED APPLICATIONS

This application is a U.S. National Phase Application of PCT International Application No. PCT/US2019/60514, filed Nov. 8, 2019, which claims the benefit of priority to U.S. Provisional Application No. 62/758,265, titled HEAT SINK FASTENER, filed 9 Nov. 2018, the contents of which are incorporated herein by reference in their entirety for all purposes.

FIELD OF THE INVENTION

This invention is related to a fastener for a heat sink, a heat sink assembly, and a computer product incorporating the same.

BACKGROUND OF THE INVENTION

Components such as modern large scale integrated (LSI) circuits, microprocessors, microchips and other integrated circuit devices (IC chips) that can be incorporated into modern computers generate a substantial amount of heat, especially when operating at high frequencies. Heat sinks are commonly mounted on these components to dissipate as much heat as possible. In such instances the heat sink can be mounted to the circuit board, or mounted to a mounting frame, which in turn is mounted to the circuit board on which the IC chip or other component is also mounted.

Spring clips have been used to secure heat sinks, but are sensitive to vibration. Captive fasteners, such as screws or nuts, have also been used to engage respective flanged corners of a heat sink. At higher fastening loads it is not always possible or convenient to utilize traditional fasteners. Improvements in the area of mounting a heat sink onto a computer component such as an IC chip, especially at higher loads, are continually sought. In particular, it is desirable to have a fastening system for such components that requires few steps to effect a close attachment of a heat sink, without placing an uneven load on the component, which is often delicate. For instance, some fastening systems require that a rectangular heat sink is attached by first tightening two fasteners at the corners of the heat sink then two additional fasteners to apply a clamping load, and then reversing this exact sequence when the heat sink is removed.

It has further been discovered that an increase in force may be required in some applications (up to approximately 1400 Newtons (N)) to assure proper electrical contact between the component and its mating socket. In addition it is important to utilize a fastening system that provides the correct amount of force to the component; i.e., that provides a specific level of force to effect good heat transfer and proper electrical contact without damaging the component.

SUMMARY OF THE INVENTION

A fastener configured for fastening a heat sink onto a heat generating component of a computer to dissipate heat generated by the component is disclosed. The fastener comprises the following elements: a rotatable nut that defines a cam surface and a recess that extends along a nut axis and into a distal end portion of the rotatable nut; and a stud having a proximal end portion that is configured to extend within the recess of the rotatable nut and along the nut axis. The stud also has at least one cam follower extending at an angle relative to the nut axis and configured to follow the cam surface of the rotatable nut. The stud further has a distal end portion configured to engage the component. The stud is configured to be coupled to the component and the rotatable nut is configured to be coupled to the heat sink. Thus, when the stud is extended within the recess of the rotatable nut and the at least one cam follower of the stud follows the cam surface of the rotatable nut, rotation of the rotatable nut relative to the stud causes the heat sink to be translated toward the component of the computer until the heat sink contacts the component, and then the heat sink dissipates heat from the component.

A system for fastening a heat sink onto a heat generating component of a computer is also disclosed. The fastening system has a number of elements. First, a rotatable nut defining a cam surface and a recess extending along a nut axis that extends into a distal end portion of the rotatable nut. Second, a stud that has a proximal end portion configured to extend within the recess of the rotatable nut and along the nut axis. The stud also has at least one cam follower extending at an angle relative to the nut axis. The cam follower is configured to follow the cam surface of the rotatable nut. The stud further has a distal end portion configured to engage the component. The third element is a clip configured to provide a secondary attachment to the heat sink. The fourth element is a retainer configured to attach the nut to the heat sink.

Also disclosed is a heat sink system for dissipating heat generated by a heat generating component of a computer. The heat sink system may have a heat sink; a rotatable nut defining a cam surface and a recess extending along a nut axis, the recess extending into a distal end portion of the rotatable nut; and a stud having a proximal end portion configured to extend within the recess of the rotatable nut and along the nut axis. The stud also has at least one cam follower extending at an angle relative to the nut axis which is configured to follow the cam surface of the rotatable nut. The stud further has a distal end portion configured to engage the component. Additionally, the stud is configured to be coupled to the component and the rotatable nut is configured to be coupled to the heat sink. Thus, when the stud is extended within the recess of the rotatable nut and the at least one cam follower of the stud follows the cam surface of the rotatable nut, rotation of the rotatable nut relative to the stud causes the heat sink to be translated towards the component of the computer, the heat sink contacts the component and the heat sink dissipates heat from the component.

Also disclosed is a computer which may have: a heat generating component for the computer; a heat sink for dissipating heat from the component; a rotatable nut defining a cam surface and a recess extending along a nut axis that extends into a distal end portion of the rotatable nut; and a stud that has a proximal end portion which is configured to extend within the recess of the rotatable nut and along the nut axis. The stud also has at least one cam follower extending at an angle relative to the nut axis which is configured to follow the cam surface of the rotatable nut. The stud further has a distal end portion configured to engage the component. Thus, the stud is configured to be coupled to the component and the rotatable nut is configured to be coupled to the heat sink. Hence, when the stud is extended within the recess of the rotatable nut and the at least one cam follower of the stud follows the cam surface of the rotatable nut, rotation of the rotatable nut relative to the stud causes the heat sink to be translated toward the component of the computer, the heat sink contacts the component and the heat sink dissipates heat from the component.

Also disclosed is a method of coupling a heat generating component attached to a base to a heat sink. The base has a spring and a stud extending from the spring. The method may have the steps of: a) Coupling a rotatable nut to the heat sink, and wherein the rotatable nut defines a cam surface and a recess extending along a nut axis, the recess extending into the rotatable nut. b) Extending the proximal end portion of the stud within the recess of the rotatable nut and along the nut axis, such that at least one cam follower is positioned on the cam surface of the rotatable nut. c) Rotating the rotatable nut relative to the stud. Thus, rotation of the nut causes the heat sink to be translated toward the base and the heat sink contacts the heat generating component with a contact force, wherein the contact force is related to a stiffness coefficient of the spring.

BRIEF DESCRIPTION OF THE DRAWINGS

FIGS. 10A-10F are perspective, top, left side, front, right side, and bottom views of the rotatable nut;

FIGS. 12A-12G are perspective, top, front, left side, back, right side, and bottom views of the clip.

DETAILED DESCRIPTION OF THE INVENTION

Figure 1:
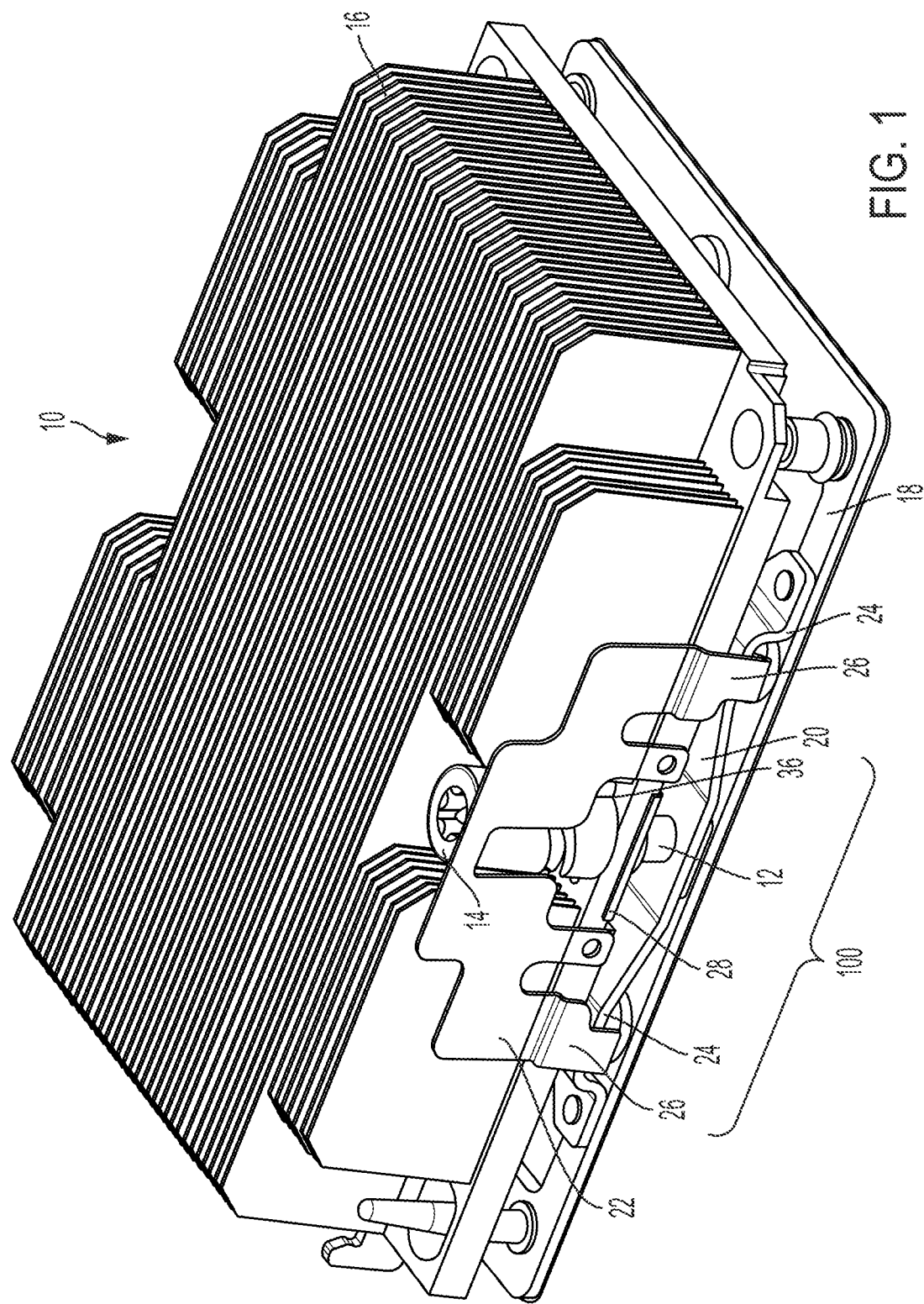
FIG. 1 is a perspective view of a fastener according to an aspect of the invention.

Although the invention is illustrated and described herein with reference to specific embodiments, the invention is not intended to be limited to the details shown. Rather, various modifications may be made in the details within the scope and range of equivalents of the claims and without departing from the invention.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected" or "coupled" refer to a relationship wherein structures are secured or attached to one another either directly or indirectly through intervening structures, as well as both removable or rigid attachments or relationships, unless expressly described otherwise. The term, "proximal" is understood to refer to a position closest to an attachment point and the term, "distal" is understood to refer to a position away from an attachment point.

The term "component" or "heat generating component" as used herein may also refer to the base to which a heat generating component is mounted. Therefore, it should be understood that while the following detailed description describes the fastener as being attached to the component, the fastener is preferably attached to a support or base for the component, such as a bolster plate or a printed circuit board, upon which the component is mounted and that therefore the fastener is connected indirectly to the component, via the base or the support for the component.

The following description is made with reference to the drawings.

Aspect 1. A fastener 100 configured for fastening a heat sink 16 onto a heat generating component 18 of a computer to dissipate heat generated by the component 18, the fastener 100 comprising:

a rotatable nut 14 defining a cam surface 30 and a recess 32 extending along a nut axis 34, the recess 32 extending into a distal end portion of the rotatable nut 14; and a stud 12 having a proximal end portion configured to extend within the recess 32 of the rotatable nut 14 and along the nut axis 34, the stud 12 also having at least one cam follower 44 extending at an angle relative to the nut axis 34 and configured to follow the cam surface 30 of the rotatable nut 14, and the stud 12 further having a distal end portion configured to engage the component 18;

wherein the stud 12 is configured to be coupled to the component 18 and the rotatable nut 14 is configured to be coupled to the heat sink 16; and wherein, when the stud 12 is extended within the recess 32 of the rotatable nut 14 and the at least one cam follower 44 of the stud 12 follows the cam surface 30 of the rotatable nut 14, rotation of the rotatable nut 14 relative to the stud 12 causes the heat sink 16 to be translated toward the component 18 of the computer, the heat sink 16 contacts the component 18, and the heat sink 16 dissipates heat from the component 18.

Aspect 2. The fastener 100 of aspect 1 further comprising a spring 20, wherein the spring 20 is coupled to the component 18, and the spring 20 is biased away from the heat sink 16, and the stud 12 is coupled to the spring 20, thereby coupling the stud 12 to the component 18, wherein continued rotation of the rotatable nut 14 causes the spring 20 to flex towards the heat sink 16 and wherein the spring 20 is selected to apply a force to the component 18.

Aspect 3. The fastener 100 of aspect 1, further comprising a clip 22, wherein the clip 22 is coupled to the heat sink 16 and the clip 22 is configured to provide a secondary attachment of the heat sink 16 to the component 18.

Aspect 4. The fastener 100 of aspect 2, further comprising a clip 22, and wherein the spring 20 comprises an engagement portion 24, and wherein the clip 22 is coupled to the heat sink 16 and the clip 22 is constructed and arranged to engage with the engagement portion 24 of the spring 20, thereby providing a secondary attachment of the heat sink 16 to the component 18.

Aspect 5. The fastener 100 of aspect 4, wherein the clip 22 is constructed and arranged so that a reversible deflection of the clip 22 causes a disengagement of the clip 22 from the engagement portion 24 of the spring 20.

Aspect 6. The fastener 100 of aspect 1, further comprising a retainer 28, wherein the retainer 28 is constructed and arranged to couple the rotatable nut 14 to the heat sink 16.

Aspect 7. The fastener 100 of aspect 2, wherein the heat sink 16 comprises at least one hole 36 configured for accommodating the stud 12, wherein the stud 12 extends through the at least one hole 36 in the heat sink 16.

Aspect 8. The fastener 100 of aspect 1, wherein the stud 12 comprises two cam followers 44 extending at an angle of 90 degrees from the nut axis 34 and located opposite each other, and wherein the cam followers 44 comprise the ends of a cross pin that is installed in a hole in the stud 12.

Aspect 9. The fastener 100 of aspect 1, wherein when the nut 14 is rotated through at least 90 degrees clockwise, the heat sink 16 contacts the component 18.

Aspect 10. The fastener 100 of aspect 1, comprising one heat generating component 18 for the computer, one heat sink 16 for dissipating heat from the component 18, two studs 12 each comprising at least one cam follower 44; and two rotatable nuts 14, each associated with one of the two studs 12; and wherein the heat sink 16 has a front side and a back side 10 and the component 18 has a corresponding front side and corresponding back side 10, and wherein one of the two studs 12 and one of the two rotatable nuts 14 are associated with the front sides of the heat sink 16 and the component 18 and the other of the two studs 12 and the other of the two rotatable nuts 14 are associated with the back sides 10 of the heat sink 16 and the component 18.

Aspect 11. A system for fastening a heat sink 16 onto a heat generating component 18 of a computer, the system comprising: a rotatable nut 14 defining a cam surface 30 and a recess 32 extending along a nut axis 34, the recess 32 extending into a distal end portion of the rotatable nut 14; a stud 12 having a proximal end portion configured to extend within the recess 32 of the rotatable nut 14 and along the nut axis 34, the stud 12 also having at least one cam follower 44 extending at an angle relative to the nut axis 34 and configured to follow the cam surface 30 of the rotatable nut 14, the stud 12 further having a distal end portion configured to engage the component 18; a clip 22 configured to provide a secondary attachment to the heat sink 16; and a retainer 28 configured to attach the nut 14 to the heat sink 16.

Aspect 12. A heat sink system for dissipating heat generated by a heat generating component 18 of a computer, the heat sink 16 system comprising:
a heat sink 16;
a rotatable nut 14 defining a cam surface 30 and a recess 32 extending along a nut axis 34, the recess 32 extending into a distal end portion of the rotatable nut 14;
a stud 12 having a proximal end portion configured to extend within the recess 32 of the rotatable nut 14 and along the nut axis 34, the stud 12 also having at least one cam follower 44 extending at an angle relative to the nut axis 34 and configured to follow the cam surface 30 of the rotatable nut 14, the stud 12 further having a distal end portion configured to engage the component 18;

wherein the stud 12 is configured to be coupled to the component 18 and the rotatable nut 14 is configured to be coupled to the heat sink 16; and wherein, when the stud 12 is extended within the recess 32 of the rotatable nut 14 and the at least one cam follower 44 of the stud 12 follows the cam surface 30 of the rotatable nut 14, rotation of the rotatable nut 14 relative to the stud 12 causes the heat sink 16 to be translated towards the component 18 of the computer, the heat sink 16 contacts the component 18 and the heat sink 16 dissipates heat from the component 18.

Aspect 13. The heat sink system of aspect 12, further comprising a spring 20, wherein the spring 20 is coupled to the component 18 and the spring 20 is biased away from the heat sink 16, and the stud 12 is coupled to the spring 20, thereby coupling the stud 12 to the component 18.

Aspect 14. The heat sink system of aspect 12, further comprising a clip 22, wherein the clip 22 is coupled to the heat sink 16 and the clip 22 is configured to provide a secondary attachment of the heat sink 16 to the component 18.

Aspect 15. The heat sink system of aspect 13, further comprising a clip 22, and wherein the spring 20 comprises an engagement portion 24, and wherein the clip 22 is coupled to the heat sink 16 and the clip 22 is configured to engage with the engagement portion 24 of the spring 20, thereby providing a secondary attachment of the heat sink 16 to the component 18.

Aspect 16. The heat sink system of aspect 15, wherein the clip 22 is configured so that a reversible deflection of the clip 22 causes a disengagement of the clip 22 from the engagement portion 24 of the spring 20.

Aspect 17. The heat sink system of aspect 12, further comprising a retainer 28, wherein the retainer 28 is configured to couple the rotatable nut 14 to the heat sink 16.

Aspect 18. The heat sink system of aspect 13, wherein the heat sink 16 comprises at least one hole 36 configured for accommodating the stud 12 and wherein the stud 12 extends through the hole 36 in the heat sink 16.

Aspect 19. The heat sink system of aspect 12 wherein the stud 12 comprises two cam followers 44, each extending at an angle of 90 degrees from the nut axis 34 and located opposite each other, and wherein the cam followers 44 comprise the ends of a cross pin that is installed in a hole in the stud 12.

Aspect 20. The heat sink 16 system of aspect 12 wherein when the nut 14 is rotated through at least 90 degrees clockwise, the heat sink 16 contacts the component 18.

Aspect 21. A computer comprising:
a heat generating component 18 for the computer;
a heat sink 16 for dissipating heat from the component 18;
a rotatable nut 14 defining a cam surface 30 and a recess 32 extending along a nut axis 34, the recess 32 extending into a distal end portion of the rotatable nut 14;
a stud 12 having a proximal end portion configured to extend within the recess 32 of the rotatable nut 14 and along the nut axis 34, the stud 12 also having at least one cam follower 44 extending at an angle relative to the nut axis 34 and configured to follow the cam surface 30 of the rotatable nut 14, and the stud 12 further having a distal end portion configured to engage the component 18;

wherein the stud 12 is configured to be coupled to the component 18 and the rotatable nut 14 is configured to be coupled to the heat sink 16; and wherein, when the stud 12 is extended within the recess 32 of the rotatable nut 14 and the at least one cam follower 44 of the stud 12 follows the cam surface 30 of the rotatable nut 14, rotation of the rotatable nut 14 relative to the stud 12 causes the heat sink 16 to be translated toward the component 18 of the computer, the heat sink 16 contacts the component 18 and the heat sink 16 dissipates heat from the component 18.

Aspect 22. The computer of aspect 21, further comprising a spring 20, wherein the spring 20 is coupled to the component 18, and the spring 20 is biased away from the heat sink 16, and the stud 12 is coupled to the spring 20, thereby coupling the stud 12 to the component 18.

Aspect 23. The computer of aspect 21, further comprising a clip 22, wherein the clip 22 is coupled to the heat sink 16 and the clip 22 is configured to provide a secondary attachment of the heat sink 16 to the component 18.

Aspect 24. The computer of aspect 22, further comprising a clip 22, and wherein the spring 20 comprises an engagement portion 24, and wherein the clip 22 is coupled to the heat sink 16 and the clip 22 is configured to engage with the engagement portion 24 of the spring 20, thereby providing a secondary attachment of the heat sink 16 to the component 18.

Aspect 25. The computer of aspect 24, wherein the clip 22 is configured so that a reversible deflection of the clip 22 causes a disengagement of the clip 22 from the engagement portion 24 of the spring 20.

Aspect 26. The computer of aspect 22, wherein the heat sink 16 comprises at least one hole 36 configured for accommodating the stud 12 and wherein the stud 12 extends through the at least one hole 36 in the heat sink 16.

Aspect 27. The computer of aspect 21, wherein the stud 12 comprises two cam followers 44, each extending at an angle of 90 degrees from the nut axis 34 and located opposite each other, and wherein the cam followers 44 comprise the ends of a cross pin that is installed in a hole in the stud 12.

Aspect 28. The computer of aspect 21, wherein when the nut 14 is rotated through at least 90 degrees clockwise, the heat sink 16 contacts the component 18.

Aspect 29. A method of coupling a heat generating component 18 attached to a base to a heat sink 16, the base having a spring 20 and a stud 12 extending from the spring 20, the method comprising the steps of:

a) coupling a rotatable nut 14 to the heat sink 16, and wherein the rotatable nut 14 defines a cam surface 30 and a recess 32 extending along a nut axis 34, the recess 32 extending into the rotatable nut 14;

b) extending the proximal end portion of the stud 12 within the recess 32 of the rotatable nut 14 and along the nut axis 34, wherein at least one cam follower 44 is positioned on the cam surface 30 of the rotatable nut 14;

c) rotating the rotatable nut 14 relative to the stud 12;

wherein rotation of the nut 14 causes the heat sink 16 to be translated toward the base and the heat sink 16 contacts the heat generating component 18 with a contact force, wherein the contact force is related to a stiffness coefficient of the spring 20.

Aspect 30. The method according to aspect 29, wherein a foot 26 of a clip 22 associated with the heat sink 16 engages an engagement portion 24 of the spring 20, thereby providing a secondary catch coupling the heat sink 16 to the heat generating component 16 attached to the base.

FIG. 1 shows a perspective view of a fastener 100 in place, but not yet tightened. It should be understood, that while only one fastener 100 is shown in FIG. 1, there are two such fasteners 100. The other fastener 100 is located at a side 10 opposite the fastener 100 which is shown in FIG. 1. For convenience, the location 10 can be considered the back and therefore the location of the visible fastener 100 may be considered the front.

The fastener 100 comprises a stud 12 and a rotatable nut 14. The fastener 100 serves to attach a heat sink 16 and to bring the heat sink 16 into close contact with to a heat generating component 18 for a computer or to a support for the 18. Non-limiting examples of such heat generating components 18 include large scale integrated (LSI) circuits, microprocessors, microchips and other integrated circuit devices (IC chips) that can be incorporated into modern computers. The fastener 100 serves to bring the heat sink 16 into close contact with such heat-generating components 18, so that the heat sink 16 can effectively dissipate the heat that the component 18 generates. It should be understood that while the following detailed description describes the fastener as being attached to the component 18, the fastener is preferably attached to a support or base for the component 18, such as a bolster plate or a printed circuit board, upon which the component 18 is mounted.

Also shown in FIG. 1 is a leaf spring 20 which is fixedly attached to the component 18. This spring 20 is biased away from the heat sink 16, i.e., towards the component. A clip 22 is attached to the heat sink 16. The spring 20 has two engagement portions 24 and the clip 22 has two feet 26, which are configured to engage with the engagement portions 24 of the spring 20, thereby providing a secondary catch or attachment of the heat sink 16 to the component 18.

The stud 12 is attached to the spring 20 and the rotatable nut 14 is attached to the heat sink 16 with a retainer 28. It is important to realize at this point that while the following description discusses the spring 20 as being attached to the component 18, and biased away from the heat sink 16, the spring 20 could, in an alternative embodiment, be attached to the heat sink 16 and therefore be biased away from the component 18.

Figure 2:
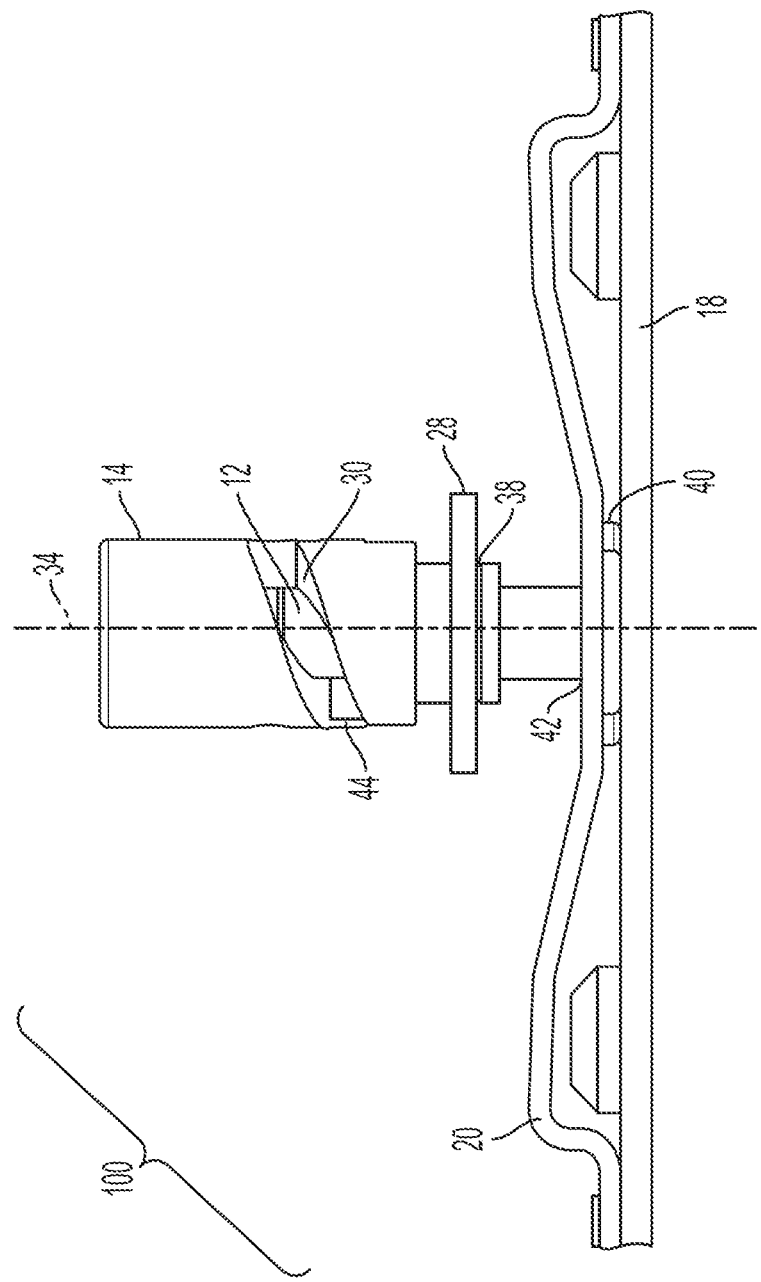
FIG. 2 is a front view of certain elements of the fastener according to an aspect of the invention.

Turn next to FIG. 2, which shows a front view of the fastener 100, with the component 18, the heat sink 16 and the clip 22 removed for clarity. As can be seen in FIG. 2 and also in detail in FIG. 10, the rotatable nut 14 defines a cam surface 30 and a recess 32. The recess 32 extends along an axis 34 of the nut 14 into the distal portion of the nut 14. As can be seen, the cam surface 30 has a generally spiral shape and extends from a position closer to the proximal portion of the nut 14 circumferentially around the nut to a position closer to the distal portion of the nut 14. The proximal portion of the nut 14 is configured to fit into a hole 36 (indicated in FIG. 1) in heat sink 16. The proximal portion of the nut 14 also has a notch 38, which is configured to accept the retainer 28. As was seen in FIG. 1, the retainer 28 (shown in more detail at FIG. 11) is configured to slide into the notch 38, thereby locking the proximal portion of the nut 14 onto the heat sink 16.

Also shown in FIG. 2, and in more detail in FIG. 9, is the stud 12. The distal end of the stud 12 has a flange 40. The stud 12 is configured to be attached at attachment point 42 on the spring 20 and then into the recess 32 in the nut 14. The flange 40 is preferably welded to attachment point 42 on the spring 20 and thus the stud 12 is attached to the spring 20. In addition, the hole 36 in the heat sink 16 and spring attachment point 42 are coaxial, and therefore when the stud 12 is inserted into the recess 32 in the nut 14, the spring 20 is coupled to the heat sink 16. Since the spring 20 is coupled to the component 18, via the spring 20, the heat sink 16 is thereby attached to the component 18.

The stud 12 additionally has two cam followers 44 (only one is visible in FIG. 2) located on the stud 12. These two cam followers 44 are located opposite each other and extend at an angle of 90 degrees from the stud 12. Therefore, as can be seen in FIG. 2, the cam followers 44 extend at an angle of 90 degrees from the nut axis 34 as well.

In an embodiment, these two cam followers 44 may be opposite ends of a cross pin that is inserted into a hole (not shown) in the stud 12. Therefore, one possible embodiment of assembling the fastener may be i) nut 14 is placed in heat sink 16; ii) retainer 28 is installed; iii) clip 22 is attached with screws or rivets or other suitable attachment method to the heat sink 16; iv) the stud 12 is welded to the spring 20; v) then the cam followers 44 in the form of a cross pin are installed in the stud 12.

In an another embodiment, mentioned above, wherein the stud 12 is attached to the component, an assembly method embodiment may be i) the spring 12 is attached to the heat sink 16; ii) the nut 14 installed in the heat sink; iii) the retainer 28 is installed; iv) the clip 22 is attached with screws or rivets or other suitable attachment method to the heat sink 16; iv) the flange 40 on the stud 12, which has the cam followers 44 attached is welded to the component 18.

Figure 3:
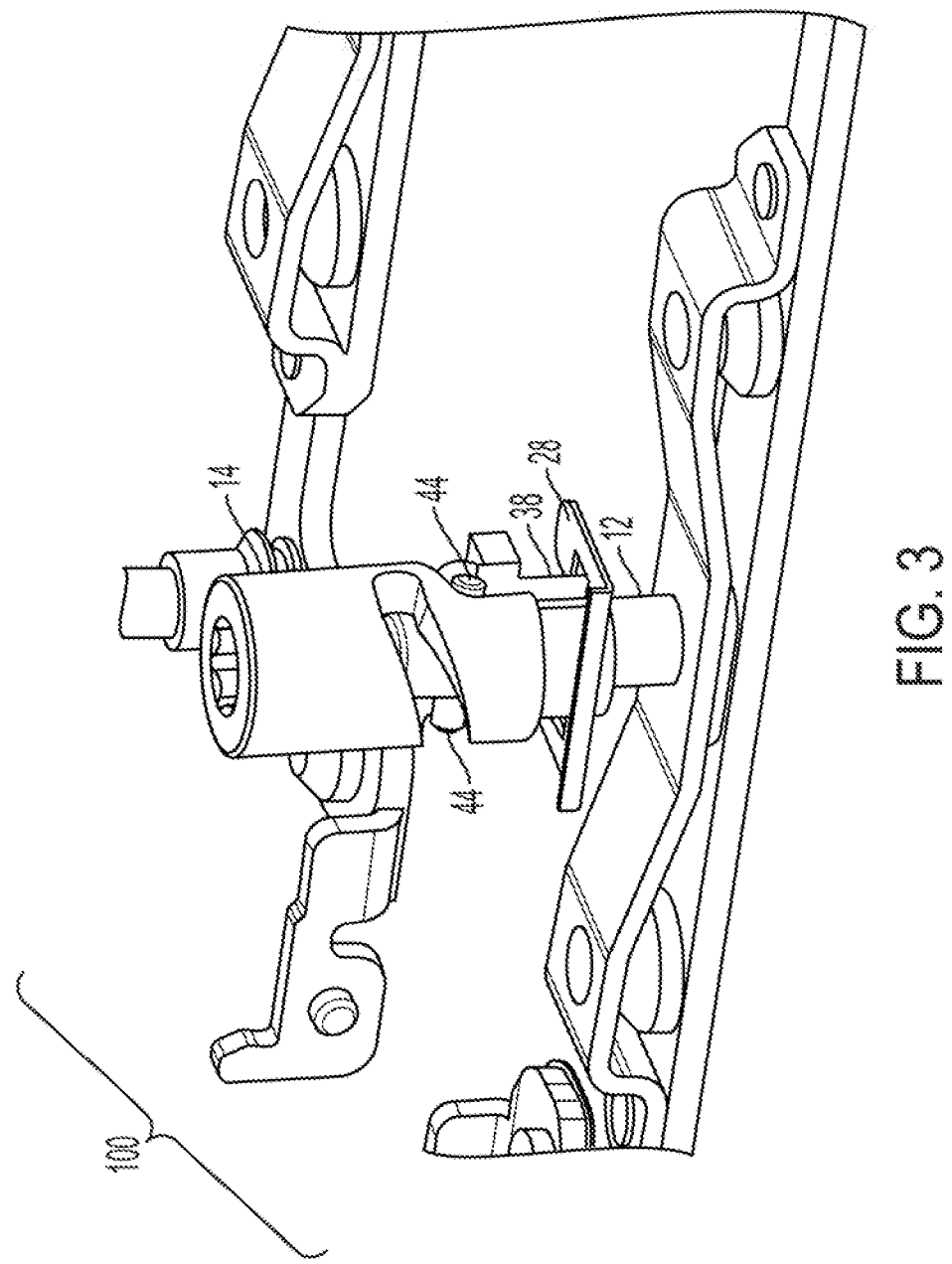
FIG. 3 is a perspective view of certain elements of the fastener according to an aspect of the invention.

The cam followers 44 are configured to follow the cam surface 30 located on the nut 14. As can be appreciated from examining FIG. 2, as the nut 14 is rotated in a clockwise direction, the cam followers 44 move along the spiral cam surface 30, which movement urges the heat sink 16 to be translated towards the component 18, due to the spring 20 being biased away from the heat sink 16. FIG. 3 shows a perspective view of the fastener 100, with the clip 22 and heat sink 16 removed for clarity. In FIG. 3, the retainer 28 located in its position in the notch 38 on the nut 14 is more clearly shown. Both of the cam followers 44 on the stud 12 are also visible in FIG. 3. Note also that both springs 20, including the one located on the back side of the heat sink 16 (not shown) are visible in FIG. 3.

Figure 4:
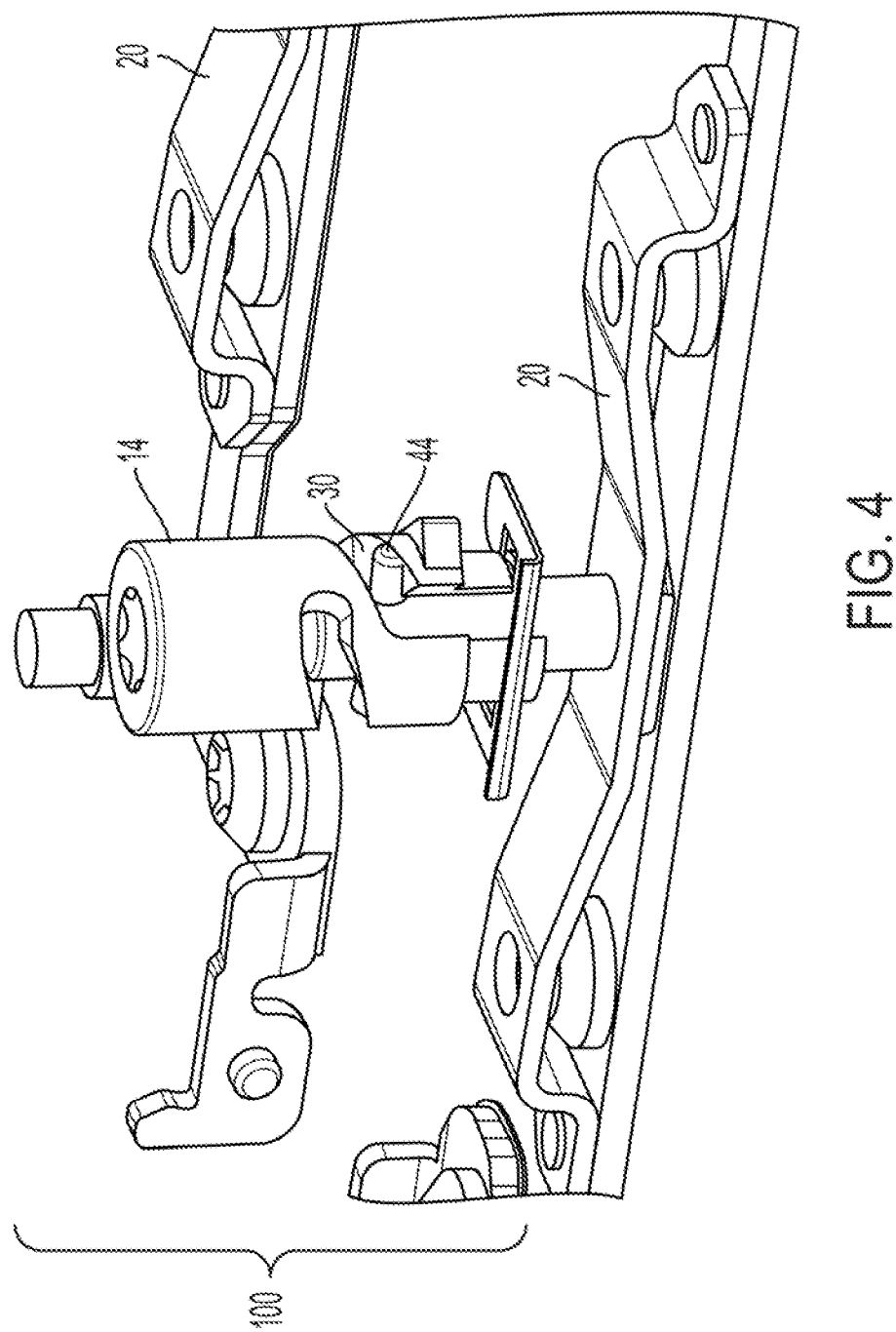
FIG. 4 is a perspective view of certain elements of the fastener according to an aspect of the invention.
Figure 5:
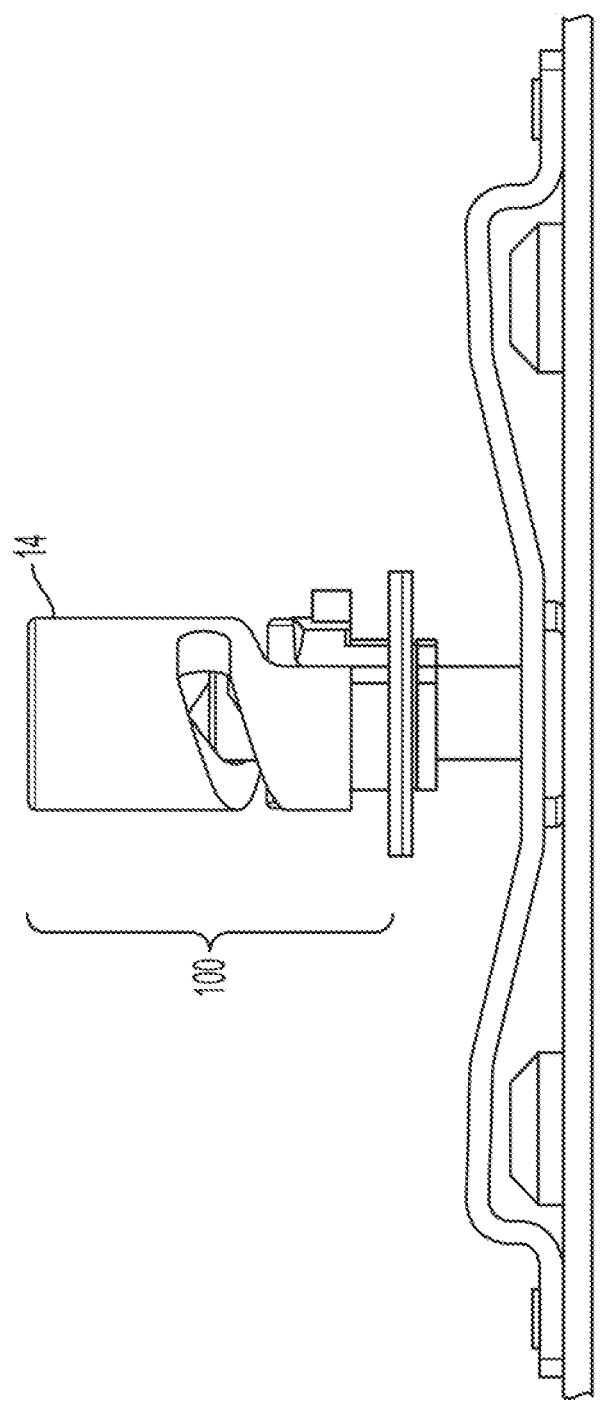
FIG. 5 is a front view of certain components of the fastener according to an aspect of the invention.

FIG. 4 shows a perspective view of the fastener 100 showing the nut 14 in a partially rotated position, so that the cam followers 44 have started to move upward along the spiral shaped cam surface 30. FIG. 5 likewise, is a front view of the fastener 100, that shows the nut 14 in a partially rotated position.

Figure 6:
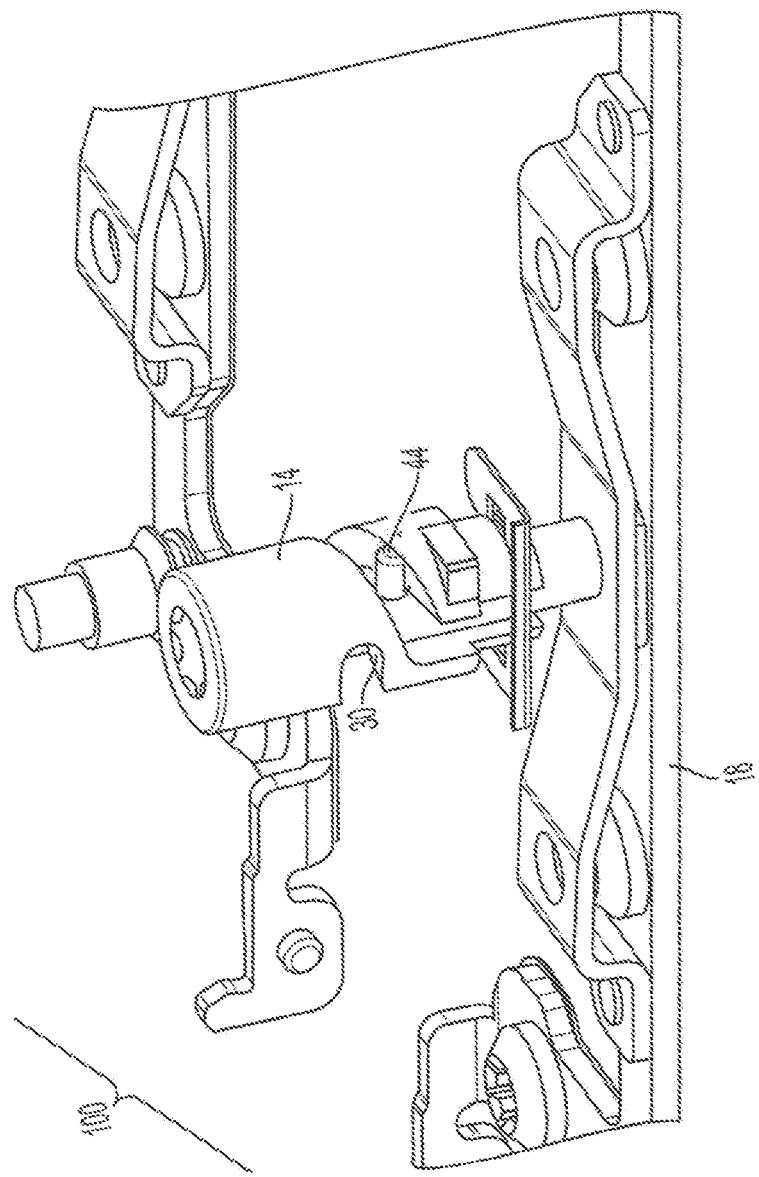
FIG. 6 is a perspective view of certain elements of the fastener according to an aspect of the invention.

FIG. 6 is a perspective view of the fastener 100, showing the nut 14 rotated approximately 45 degrees. One can see from this view that when the nut 14 has rotated 180 degrees the cam followers 44 will have moved along the entire length of the cam profile 30 from an initial position closer to the proximal portion of the nut 14 to a final position closer to the distal portion of the nut 14. When the cam followers are in this final position after the nut 14 has been rotated 180 degrees, the heat sink 16 (not shown) will be in contact with the component 18. It can be appreciated that the amount and direction of rotation necessary to effect contact of the heat sink 16 with the component 18 can be changed by suitable selection of the cam profile 30. Therefore, the nut 14 is rotated between 90 and 180 degrees to cause the heat sink 16 to contact the component 18. This rotation can be either clockwise or counterclockwise, depending on the geometry of the cam surface 30.

A person having skill in the art will also understand that the contact force between the component 18 and the heat sink 16 is related to the spring constant of the spring 20, also called the stiffness coefficient of the spring 20. The spring 20 is intended to ensure that the correct amount of force is applied between the component 18 and the heat sink 16. A stronger spring 20, i.e., more stiff, will result in a higher contact force between the component 18 and the heat sink 16 and therefore this force can be controlled by selection of a spring 20 having a particular spring constant or stiffness coefficient of the spring, thereby controlling the amount of force to be applied between the heat sink 16 and the component 18.

Figure 7A:
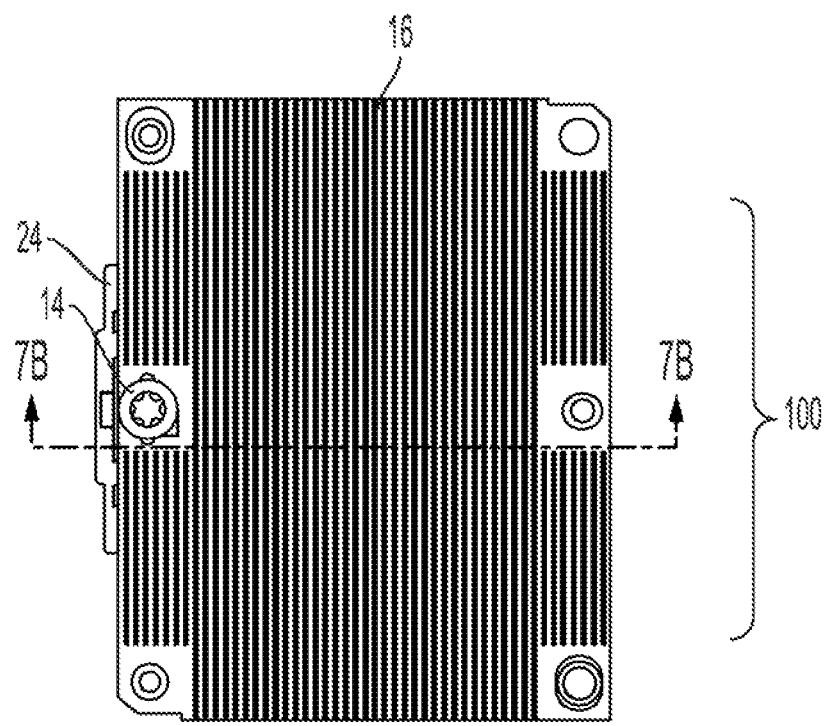
FIGS. 7A and 7B are top and cross-sectional views, respectively, of the assembled fastener in place, but not tightened.
Figure 7B:
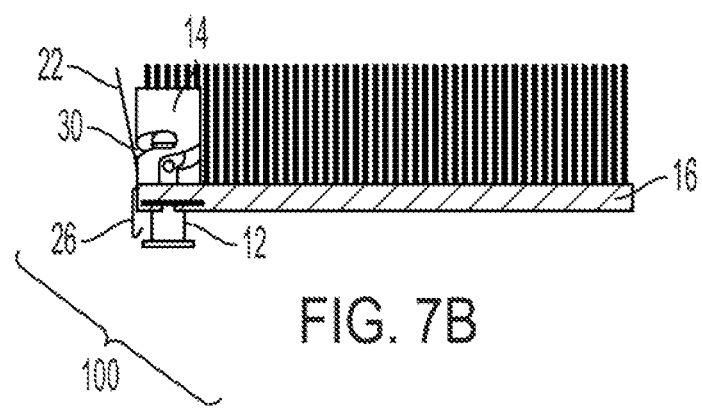

The component 18 and the spring 20 are not shown in FIGS. 7A and 7B for clarity. Likewise, it should be appreciated that in practice, there are two fasteners 100 holding the heat sink 17 in place, but for simplicity, only one is shown in FIGS. 7A and 7B. FIG. 7A shows a top view and FIG. 7B shows a side cutaway view along the line A-A of one the fasteners 100 as it attaches the heat sink 16 to the component 18. In FIG. 7B it can be seen that the cam followers 44 (only one is visible) on the stud 12 have not started to move along the cam profile 30 defined by the nut 14. Therefore the heat sink 16 has not been urged downward by the movement of the cam followers 44 along the cam profile 30 towards the component 18. However, the clip 22 is shown in FIGS. 7A and 7B and the feet 26 (one shown in FIG. 7B) are in position to engage the spring engagement portions 24 (not shown), thereby providing a secondary catch or attachment of the heat sink 16 to the component 18, even though the heat sink 16 has not translated down to contact the component 18. In this way, the heat sink 16 can be clipped into position to be translated towards the component 18, without the need to fully engage the fastener 100. This secondary catch or attachment feature permits the heat sink 16 to be positioned and then the nuts 14 on the fasteners 100 can be rotated 180 degrees clockwise in turn, without over-stressing the component 18. In addition, when the nuts 14 have not been rotated, i.e., the only the secondary catch or attachment is engaged, the feet 26 on the clip 22 can be disengaged by deflecting the distal portion of the clip 22 towards the heat sink 16, which results in the feet 26 moving away from the spring engagement portions 24 (not shown). The clip 22 is shown in more detail in FIG. 12. As can be seen in the side view on FIGS. 7B (and 8B) and also in the side views of the clip 22 in FIGS. 12D and 12F, the distal portion of the clip 22 is arranged at an angle from the feet 26, so that when the distal portion of the clip 22 is pressed towards the heat sink 18, the feet 26 are moved away from engagement with the spring engagement portions 24, thereby disengaging the clip 22. One can appreciate that when two of the fasteners 100 are located on opposing sides (i.e., front and back) of the heat sink 16, the distal portions of the clips 22 can conveniently be pressed towards each other with one hand, thus easily effecting removal of the heat sink 16 from the component 18.

Figure 8A:
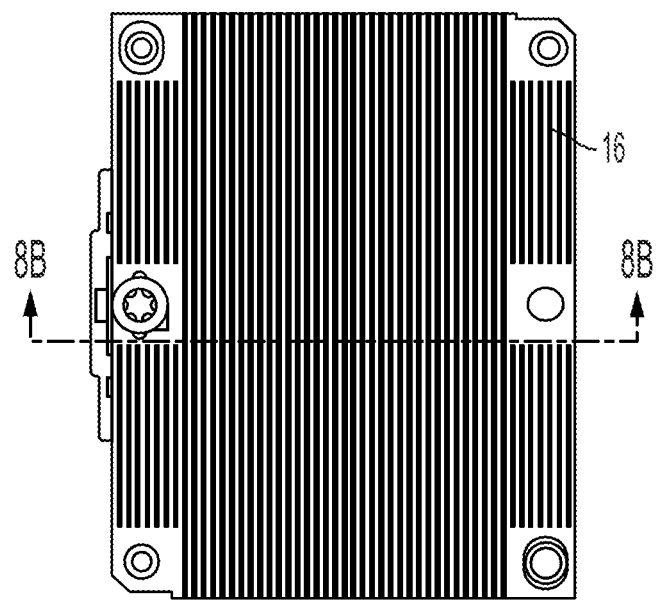
FIGS. 8A and 8B are top and cross-sectional views, respectively, of the assembled fastener in place, and tightened.
Figure 8B:
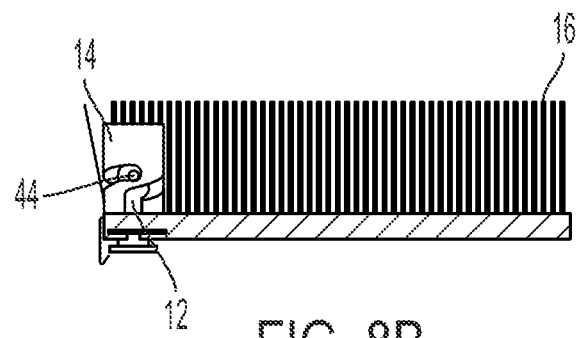
Figure 9G:
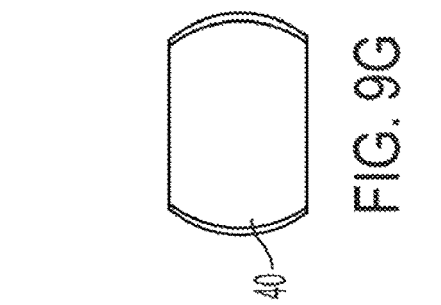
FIGS. 9A-9G are perspective, top, front, left side, back, right side, and bottom views of the stud.
Figure 9B:
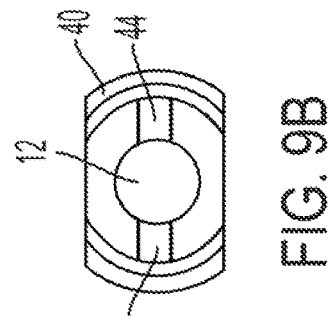
Figure 9A:
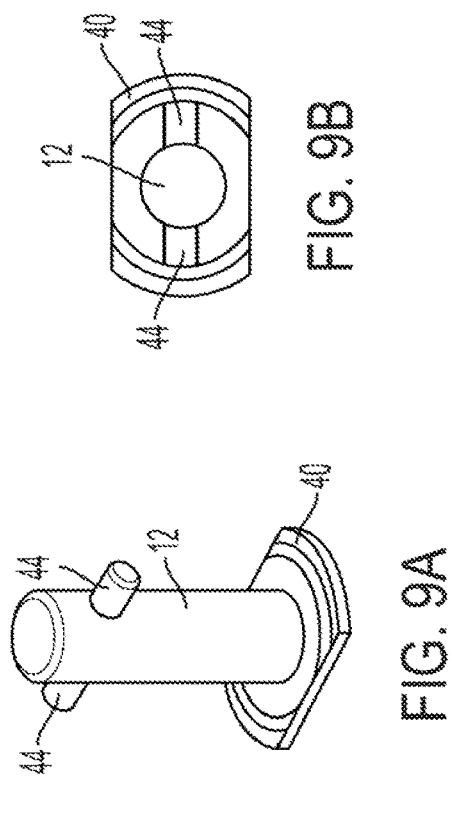
Figure 9F:
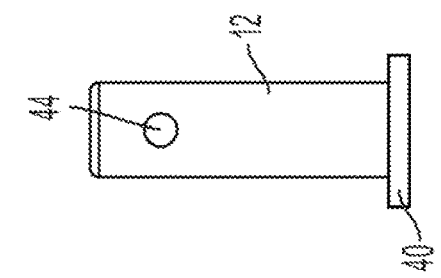
Figure 9E:
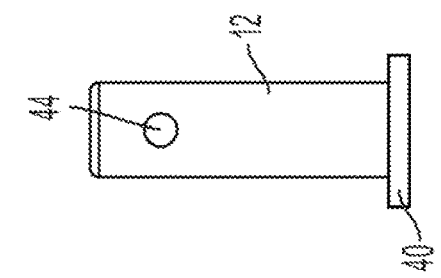
Figure 9D:
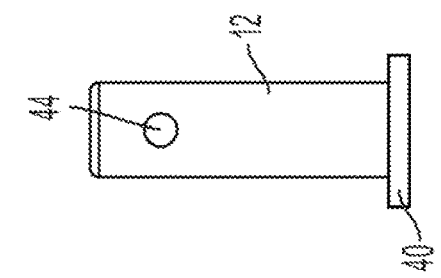
Figure 9C:
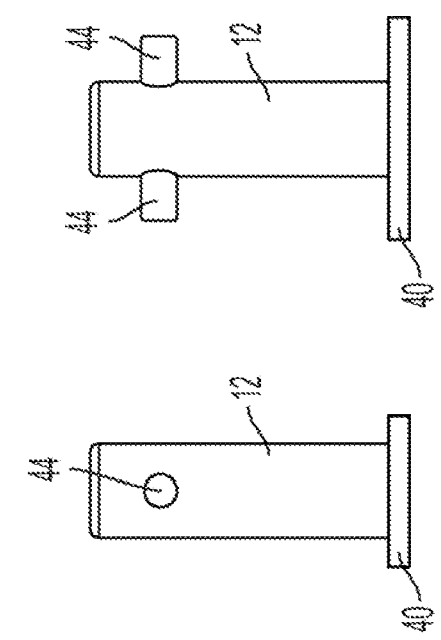
Figure 11C:
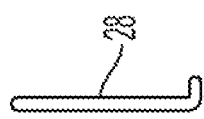
FIGS. 11A-11G are perspective, top, left side, front, right side, back, and bottom views of the retainer.
Figure 11G:
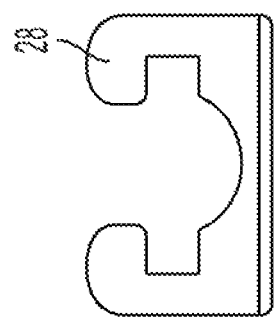
Figure 11B:
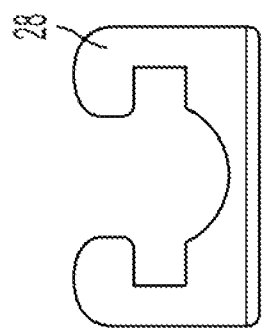
Figure 11F:
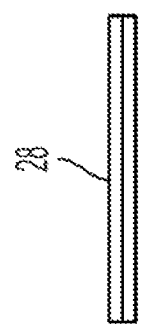
Figure 11A:
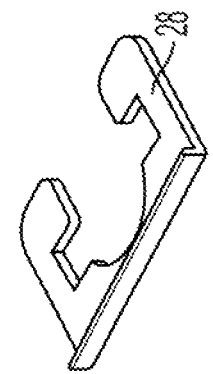
Figure 11E:
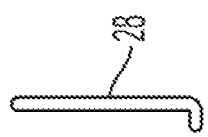
Figure 11D:

The component 18 and the spring 20 are not shown in FIGS. 8A and 8B for clarity.

FIG. 8A shows a top view and a FIG. 8B shows a side cutaway view along the line B-B of the fastener 100 as it attaches the heat sink 16 to the component 18. In FIG. 8B it can be seen that the cam followers 44 (only one is visible) on the stud 12 have completely moved along the cam profile 30 defined by the nut 14. Therefore the heat sink 16 has been urged downward by the movement of the cam followers 44 along the cam profile 30 and is contacting the component 18.

The above-described process for fastening a heat sink 16 onto the component 18 is rapid and convenient for the end-user because it comprises the simple steps rotating two nuts 14 each 180 degrees to reliably and repeatably contact the heat sink 16 with the component 18. Importantly, only two of the above-described fasteners 100 are needed to attach the heat sink 16 to the component 18. Therefore the assembly process requires only two tightening steps and the steps do not need to be performed in a specific order. This is a significant improvement over attachment methods wherein the heat sink 16 is attached to the component at each of four points (typically the corners) where four tightening operations must be performed in a specified order, so as not to damage the component. For instance, some fastening systems require that a rectangular heat sink is attached by first tightening two fasteners at the corners of a heat sink and then two additional fasteners are tightened to apply a clamping load. When removing the heat sink, this exact sequence must be performed in reverse. This is not necessary when using this fastener 100. Further, when only one of the fasteners 100 is tightened, the heat sink exhibits minimal "tilt" and therefore is less likely to damage to component.

Although not discussed, alignment pins and corresponding alignment holes could be added to the component and the heat sink assembly 16 to further simplify the alignment process.

The assembly of the heat sink 16 and the component 18, together with the fastener 18 constitute a computer product. A computer server can include one or more of the aforementioned computer products.

The fastener 100 may be provided as a kit. The fastener 100 may also be provided with a selection of springs 20 having different spring constants (also called stiffness coefficients). The end user would select the appropriate spring 20 and from the kit that would achieve a desired compression force on the component 18 for a particular application. Accordingly, the kit may be used universally with any component.

Further, it has been discovered that, in order to perform properly, heat sinks preferably have a specified load applied to clamp them on top of a processor. According to aspects of this invention, it is possible for a single user input to compress the heat sink more evenly. Also, this invention makes it possible to control the load repeatably by operation of the fastener 100, which can be advantageous in certain applications as compared to a user tightening screws or nuts without the springs 20 which serve to ensure that the correct load is applied to the component 18. Moreover, it is noted that for applications requiring that the screws be tightened in a pre-defined sequence, damage to the component 18 (i.e., chip) could result if the pre-defined sequence is not followed. For instance, some fastening systems require that a rectangular heat sink is attached by first tightening two fasteners at the corners of the heat sink and then tightening two additional fasteners to apply a clamping load. This exact sequence must be performed in reverse when the heat sink is removed. No such tightening sequencing is required for the fastener 100.

It has further been discovered that an increase in force may be required in some applications (up to approximately 1400 Newtons (N)) to assure proper electrical contact between the component and its mating socket. In addition it is important to utilize a fastening system that provides the correct amount of force to the component; i.e., that provides a specific level of force to effect good heat transfer and proper electrical contact without damaging the component. Two of the fasteners 100 of this invention are capable of applying such a force when used together, i.e., up to 700 N per fastener. Also, the fastener can apply such forces while being scalable and modifiable simply by exchanging springs. Accordingly, the fastener can apply even pressure with less chance of damaging chips or other components of a computer product. Additionally, the low profile configuration of the fastener preferably does not block air flow across the heat sink.

The force range appropriate for the fastener 100 would be 225 to 700 Newtons (N).

As will be understood, a relatively precise load or load range can be applied to a component using the fastener 100 of this invention. More specifically, geometries and properties of the fastener 100 can be modified in order to customize the fastener 100 for particular load requirements.

Although the embodiments of a fastener 100 selected for illustration in this application are configured for attaching a heat sink onto a heat generating component to dissipate heat from the component, it will be appreciated that the latch assembly of this invention may be used to latch a wide variety of components relative to one another. For example, the fastener of this invention can be configured to releasably engage two or more components and may be especially useful where the load or compression or pressure applied to one or more of the components is to be increased, decreased or otherwise controlled within a range.

It will be appreciated by one of skill in this art that variations and modifications to the embodiments shown and selected for illustration and description can be made without departing from the spirit or the scope of this invention. For example the number of fasteners can be reduced or increased, depending on the application. While fasteners may be suitable for some applications, it may be possible to provide a single fastener or more than two such fasteners for other applications. Additionally, the location of the fastener can be moved, such as by relocating them from the front and back of the heat sink to opposing sides or corners.

Also the load applied to the heat sink can be adjusted in a variety of ways; for example, by changing the spring and/or by changing the cam shape that results in compression. Additionally, while one spring on each side of the heat sink may be suitable in order to provide balance and increased compression force, it is contemplated that there can be a more than one spring on each side or other numbers of springs. More than one fastener on each side of the heat sink is also within the scope of the invention.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A fastener configured for fastening a heat sink onto a heat generating component of a computer to dissipate heat generated by the heat generating component, the fastener comprising:
   a rotatable nut defining a cam surface and a recess extending along a nut axis, the recess extending into a distal end portion of the rotatable nut; and
   a stud having a proximal end portion configured to extend within the recess of the rotatable nut and along the nut axis, the stud also having at least one cam follower extending at an angle relative to the nut axis and configured to follow the cam surface of the rotatable nut, and the stud further having a distal end portion configured to engage the heat generating component;

wherein the stud is configured to be coupled to the heat generating component and the rotatable nut is configured to be coupled to the heat sink; and wherein, when the stud is extended within the recess of the rotatable nut and the at least one cam follower of the stud follows the cam surface of the rotatable nut, a rotation of the rotatable nut relative to the stud causes the heat sink to be translated toward the heat generating component of the computer, the heat sink contacts the heat generating component, and the heat sink dissipates the heat from the heat generating component.

2. The fastener of claim 1 further comprising a spring coupled to the heat generating component, and the spring is biased away from the heat sink, and the stud is coupled to the spring, thereby coupling the stud to the heat generating component, wherein a continuation of the rotation of the rotatable nut causes the spring to flex towards the heat sink and wherein the spring is selected to apply a force to the heat generating component.

3. The fastener of claim 2, further comprising a clip, wherein the spring comprises an engagement portion, and wherein the clip is coupled to the heat sink and the clip is constructed and arranged to engage with the engagement portion of the spring, thereby providing a secondary attachment of the heat sink to the heat generating component.

4. The fastener of claim 3, wherein the clip is constructed and arranged so that a reversible deflection of the clip causes a disengagement of the clip from the engagement portion of the spring.

5. The fastener of claim 2, wherein the heat sink comprises at least one hole configured for accommodating the stud, wherein the stud extends through the at least one hole in the heat sink.

6. The fastener of claim 1, further comprising a clip coupled to the heat sink and the clip is configured to provide a secondary attachment of the heat sink to the heat generating component.

7. The fastener of claim 1, further comprising a retainer constructed and arranged to couple the rotatable nut to the heat sink.

8. The fastener of claim 1, wherein the at least one cam follower of the stud comprises two cam followers each extending at an angle of 90 degrees from the nut axis and located opposite each other, and
wherein the two cam followers comprise ends of a cross pin that is installed in a hole in the stud.

9. The fastener of claim 1, wherein when the rotatable nut is rotated through at least 90 degrees clockwise, the heat sink contacts the heat generating component.

10. The fastener of claim 1, wherein one of the heat generating component for the computer, one of the heat sink for dissipating the heat from the one heat generating component, two of the stud each comprising h at least one cam follower, and two of the rotatable nut each associated with a respective one of the two of the stud;
wherein the one of the heat sink has a front side and a back side,
wherein the one of the heat generating component has a corresponding front side and a corresponding back side, and
wherein one of the two of the stud and one of the two of the rotatable nut are associated with the front side of the heat sink and the corresponding front side of the one heat generating component and another of the two of the stud and another of the two of the rotatable nut are associated with the back side of the heat sink and the corresponding back side of the one heat generating component.

11. A system for fastening a heat sink onto a heat generating component of a computer, the system comprising:
a rotatable nut defining a cam surface and a recess extending along a nut axis, the recess extending into a distal end portion of the rotatable nut;
a stud having a proximal end portion configured to extend within the recess of the rotatable nut and along the nut axis, the stud also having at least one cam follower extending at an angle relative to the nut axis and configured to follow the cam surface of the rotatable nut, the stud further having a distal end portion configured to engage the heat generating component;
a clip configured to provide a secondary attachment to the heat sink; and
a retainer configured to attach the rotatable nut to the heat sink.

12. A heat sink system for dissipating heat generated by a heat generating component of a computer, the heat sink system comprising:
a heat sink;
a rotatable nut defining a cam surface and a recess extending along a nut axis, the recess extending into a distal end portion of the rotatable nut;
a stud having a proximal end portion configured to extend within the recess of the rotatable nut and along the nut axis, the stud also having at least one cam follower extending at an angle relative to the nut axis and configured to follow the cam surface of the rotatable nut, the stud further having a distal end portion configured to engage the heat generating component;
wherein the stud is configured to be coupled to the heat generating component and the rotatable nut is configured to be coupled to the heat sink; and
wherein, when the stud is extended within the recess of the rotatable nut and the at least one cam follower of the stud follows the cam surface of the rotatable nut, a rotation of the rotatable nut relative to the stud causes the heat sink to be translated towards the heat generating component of the computer, the heat sink contacts the heat generating component and the heat sink dissipates the heat from the heat generating component.

13. The heat sink system of claim 12, further comprising a spring coupled to the heat generating component and the spring is biased away from the heat sink, and the stud is coupled to the spring, thereby coupling the stud to the heat generating component.

14. The heat sink system of claim 13, further comprising a clip, and wherein the spring comprises an engagement portion, and wherein the clip is coupled to the heat sink and the clip is configured to engage with the engagement portion of the spring, thereby providing a secondary attachment of the heat sink to the heat generating component.

15. The heat sink system of claim 14, wherein the clip is configured so that a reversible deflection of the clip causes a disengagement of the clip from the engagement portion of the spring.

16. The heat sink system of claim 13, wherein the heat sink comprises at least one hole configured for accommodating the stud and wherein the stud extends through the at least one hole in the heat sink.

17. The heat sink system of claim 12, further comprising a clip coupled to the heat sink and the clip is configured to provide a secondary attachment of the heat sink to the heat generating component.

18. The heat sink system of claim 12, further comprising a retainer configured to couple the rotatable nut to the heat sink.

19. The heat sink system of claim 12 wherein the at least one cam follower of the stud comprises two cam followers each extending at an angle of 90 degrees from the stud and located opposite each other, and
wherein the two cam followers comprise ends of a cross pin that is installed in a hole in the stud.

20. The heat sink system of claim 12 wherein when the rotatable nut is rotated through at least 90 degrees clockwise, the heat sink contacts the heat generating component.

21. A computer comprising:
a heat generating component for the computer;
a heat sink for dissipating heat from the heat generating component;
a rotatable nut defining a cam surface and a recess extending along a nut axis, the recess extending into a distal end portion of the rotatable nut; and
a stud having a proximal end portion configured to extend within the recess of the rotatable nut and along the nut axis, the stud also having at least one cam follower extending at an angle relative to the nut axis and configured to follow the cam surface of the rotatable nut, and the stud further having a distal end portion configured to engage the heat generating component;
wherein the stud is configured to be coupled to the heat generating component and the rotatable nut is configured to be coupled to the heat sink; and
wherein, when the stud is extended within the recess of the rotatable nut and the at least one cam follower of the stud follows the cam surface of the rotatable nut, a rotation of the rotatable nut relative to the stud causes the heat sink to be translated toward the heat generating component of the computer, the heat sink contacts the heat generating component and the heat sink dissipates the heat from the heat generating component.

22. The computer of claim 21, further comprising a spring coupled to the heat generating component, and the spring is biased away from the heat sink, and the stud is coupled to the spring, thereby coupling the stud to the heat generating component.

23. The computer of claim 22, further comprising a clip, and wherein the spring comprises an engagement portion, and wherein the clip is coupled to the heat sink and the clip is configured to engage with the engagement portion of the spring, thereby providing a secondary attachment of the heat sink to the heat generating component.

24. The computer of claim 23, wherein the clip is configured so that a reversible deflection of the clip causes a disengagement of the clip from the engagement portion of the spring.

25. The computer of claim 22, wherein the heat sink comprises at least one hole configured for accommodating the stud and wherein the stud extends through the at least one hole in the heat sink.

26. The computer of claim 21, further comprising a clip coupled to the heat sink and the clip is configured to provide a secondary attachment of the heat sink to the heat generating component.

27. The computer of claim 21, wherein the at least one cam follower of the stud comprises two cam followers each extending at an angle of 90 degrees from the nut axis and located opposite each other, and wherein the two cam followers comprise ends of a cross pin that is installed in a hole in the stud.

28. The computer of claim 21, wherein when the rotatable nut is rotated through at least 90 degrees clockwise, the heat sink contacts the heat generating component.

29. A method of coupling a heat generating component attached to a base to a heat sink, the base having a spring and a stud extending from the spring, the method comprising steps of:
a) coupling a rotatable nut to the heat sink, wherein the rotatable nut defines a cam surface and a recess extending along a nut axis, the recess extending into the rotatable nut;
b) extending the proximal end portion of the stud within the recess of the rotatable nut and along the nut axis, wherein at least one cam follower is positioned on the cam surface of the rotatable nut; and
c) rotating the rotatable nut relative to the stud;
wherein a rotation of the rotatable nut causes the heat sink to be translated toward the base and the heat sink contacts the heat generating component with a contact force, wherein the contact force is related to a stiffness coefficient of the spring.

30. The method according to claim 29, wherein a foot of a clip associated with the heat sink engages an engagement portion of the spring, thereby providing a secondary catch coupling the heat sink to the heat generating component attached to the base.

* * * * *